(12) United States Patent
Yanai et al.

(10) Patent No.: US 9,558,307 B1
(45) Date of Patent: Jan. 31, 2017

(54) SYSTEM AND METHOD FOR PROVIDING A SCALABLE SERVER-IMPLEMENTED REGRESSION QUERY ENVIRONMENT FOR REMOTE TESTING AND ANALYSIS OF A CHIP-DESIGN MODEL

(71) Applicant: Cadence Design Systems, Inc., San Jose, CA (US)

(72) Inventors: Tal Yanai, Tel Mond (IL); Yuval Konrad, Rishon LeZion (IL)

(73) Assignee: Cadence Design Systems, Inc., San Jose, CA (US)

( * ) Notice: Subject to any disclaimer, the term of this patent is extended or adjusted under 35 U.S.C. 154(b) by 78 days.

(21) Appl. No.: 14/587,220

(22) Filed: Dec. 31, 2014

(51) Int. Cl.
  *G06F 11/22* (2006.01)
  *G06F 17/50* (2006.01)
  *G06F 17/30* (2006.01)

(52) U.S. Cl.
  CPC ..... *G06F 17/5045* (2013.01); *G06F 17/30864* (2013.01)

(58) Field of Classification Search
  USPC .......................................................... 716/136
  See application file for complete search history.

(56) References Cited

U.S. PATENT DOCUMENTS

| 7,320,090 B2 * | 1/2008 | Coulter, Jr. | ........... G06F 11/261 714/30 |
| 2014/0188438 A1 * | 7/2014 | Wessman | ................ G06F 17/50 703/1 |

* cited by examiner

*Primary Examiner* — Bryce Aisaka
(74) *Attorney, Agent, or Firm* — Pearl Cohen Zedek Latzer Baratz LLP

(57) ABSTRACT

A system and method for providing a scalable server-implemented regression query environment for remote testing and analysis of a chip-design model receives chip-design information, including the chip-design model to be tested and one or more attributes for testing the chip design model; receives a first regression simulation test request from the client-side integration client; initiates a proxy instance for a first regression simulation test to be executed by an application programming interface (API), based on the first regression simulation test request; selects, by the API, the attributes for testing the chip-design model; executes, by the API, the first regression simulation test on the chip-design model using the selected attributes; monitors, by a server-side database manager, the first regression simulation test during execution of the first regression simulation test; and stores, by the server-side database manager, one or more results of the first regression simulation test in a database.

20 Claims, 3 Drawing Sheets

SYSTEM AND METHOD FOR PROVIDING A SCALABLE SERVER-IMPLEMENTED REGRESSION QUERY ENVIRONMENT FOR REMOTE TESTING AND ANALYSIS OF A CHIP-DESIGN MODEL

FIELD OF THE INVENTION

The present invention is in the field of chip (e.g., integrated circuit) coverage testing. In particular, the present invention is directed to providing a scalable server-implemented regression query environment for remote testing and analysis of a chip-design model.

BACKGROUND OF THE INVENTION

In chip design, verification tests are run virtually on a model representing the actual chip design. Simulations may run hundreds of thousands of times (or more) and test the coverage of the chip. Coverage of a chip design refers to the percentage of the proposed chip design that was actually used during execution of a simulation of the chip design. In coverage testing, a test is a launch of one or more simulations to simulate certain conditions and to output from the simulations what the chip design will cover. A simulation is a software mimic of the hardware chip model, which can simulate a chip without manufacturing the hardware. A simulator application is used for checking the expected behavior of the chip by simulating the chip functionality using thousands or millions of simulations.

Companies that want to physically produce a chip design typically spend millions of dollars to achieve as much coverage as possible, and verification of the chip design coverage typically accounts for up to 60% of a chip company's total chip design budget. These companies do not expect to get 100% coverage during testing, but the more coverage the better, as more coverage indicates better efficiency of the chip. For example, a chip design resulting in 80-90% coverage may be considered an efficient chip design.

However, known systems for providing chip design testing generate large amounts of data from these simulations and users do not have the tools to analyze the data. Currently available verification systems are unable to provide users with adequate remote testing and analysis capabilities. Furthermore, there are scalability issues as well. For example, because large amounts of coverage data are generated, some analysis calculations are very heavy in terms of memory consumption. This creates a barrier in terms of how many concurrent requests a server can handle.

What is needed, therefore, is a solution such that verification systems can serve remote requests without overloading the server, and that will allow users to interact with regression farms to execute tests and query (e.g., test and/or analyze) regression simulation testing database results remotely.

SUMMARY OF EMBODIMENTS OF THE INVENTION

An embodiment of the invention includes a method for providing a scalable server-implemented regression query environment for remote testing and analysis of a chip-design model. In some embodiments, the remote testing and analysis may be provided via an application programming interface (API) executed by a processor of a server and a server-side database manager also executed by the processor of the server. The server may be in communication with a client-side integration client via a network. Embodiments of the method may include receiving, at the server, chip-design information, wherein the chip-design information comprises at least the chip-design model to be tested and one or more attributes for testing the chip design model; receiving, at the server, a first regression simulation test request from the client-side integration client; initiating by the server-side database manager, a proxy instance for a first regression simulation test to be executed by the API, based on the first regression simulation test request; selecting, by the API, at least one of the one or more attributes for testing the chip-design model based at least in part on the chip-design information; executing by the API, the first regression simulation test on the chip-design model using the selected at least one of the one or more attributes; monitoring, by the server-side database manager, the first regression simulation test during execution of the first regression simulation test; and storing, by the server-side database manager, one or more results of the first regression simulation test in a database.

In some embodiments, the method may further include providing information relating to the one or more results of the first regression simulation test to the client-side integration client via the network. Embodiments of the method may further include receiving, at the server, via the API, an analysis request comprising at least instructions relating to one or more queries to be executed by the server-side database manager on the one or more results of the first regression simulation test stored in the database; executing, by the server-side database manager, the one or more queries on the one or more results of the first regression simulation test to produce one or more query results, wherein the one or more query results are returned to the API based on the one or more queries; and calculating, by the API, at least one of a coverage score and a regression analysis for the chip-design model based on the analysis request and the one or more query results. Further embodiments may include providing the at least one of the calculated coverage score and the calculated regression analysis to the client-side integration client via the network.

In some embodiments, the one or more queries may include a user-defined set of one or more fields to be searched in the database. In some embodiments, the coverage score may represent a percentage of the chip that was used during execution of the first regression simulation test.

Further embodiments of the method may include incorporating the one or more attributes of the first regression simulation test in a second regression simulation test. In some embodiments, the one or more results of the first regression simulation test stored in the database are stored as write-protected data. In some embodiments, the first regression simulation test may be executed by the API in a regression farm. Some embodiments of the method may include caching the proxy instance in an API pool to serve an additional request; and terminating the proxy instance when it has not been reused within a predetermined period of time.

These and other aspects, features and advantages will be understood with reference to the following description of certain embodiments of the invention.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings. Embodiments of the invention are illustrated by way of example and not limitation in the figures of the accompanying drawings, in which like reference numerals indicate corresponding, analogous or similar elements, and in which:

Figure 1:
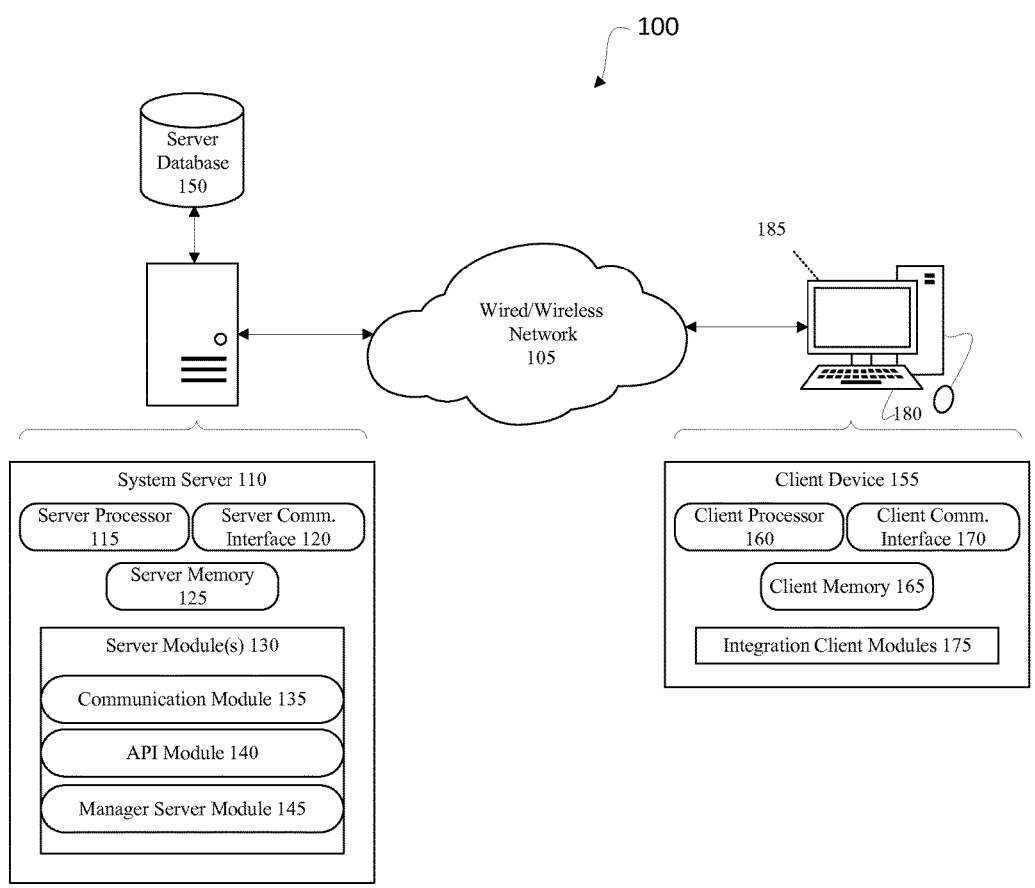
FIG. 1 is a high level diagram illustrating an example configuration of a system for providing a scalable server-implemented regression query environment for remote testing and analysis of a chip-design model according to at least one embodiment of the invention.

It will be appreciated that for simplicity and clarity of illustration, elements shown in the figures have not necessarily been drawn accurately or to scale. For example, the dimensions of some of the elements may be exaggerated relative to other elements for clarity, or several physical components may be included in one functional block or element. Further, where considered appropriate, reference numerals may be repeated among the figures to indicate corresponding or analogous elements.

DETAILED DESCRIPTION OF EMBODIMENTS OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory processor-readable storage medium that may store instructions, which when executed by the processor, cause the processor to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term set when used herein may include one or more items. Unless explicitly stated, the method embodiments described herein are not constrained to a particular order or sequence. Additionally, some of the described method embodiments or elements thereof may occur or be performed simultaneously, at the same point in time, or concurrently.

Embodiments of the invention enable remote chip design testing by providing an Application Programming Interface (API) based, for example, on Representational State Transfer (REST) architecture (e.g., a REST interface), which users can access via a client interface and/or device ("client") using a Hypertext Transfer Protocol (HTTP) based query language to request, remotely via a network such as the Internet, that an application on a remote server run a regression simulation test in a regression farm to which it has access and/or query the results (e.g., stored in a database). As understood herein, a regression simulation test may be a single launch of a simulation or one or more launches of a plurality of simulations (often in the hundreds of thousands, or more, depending on the embodiment). REST is a software architectural style which includes a coordinated set of architectural constraints applied to components, connectors, and data elements, within a distributed hypermedia system. REST ignores the details of component implementation and protocol syntax in order to focus on the roles of components, the constraints upon their interaction with other components, and their interpretation of significant data elements.

Typically, an API is understood as a particular set of rules and specifications that a software program can follow to access and make use of the services and resources provided by another particular software program that implements that API. The API serves as an interface between different software programs and facilitates their interaction, similar to the way the user interface facilitates interaction between humans and computers. Typical APIs, however, are inherently limited, as they can only provide a static (e.g., predefined) list of a particular set of rules and specifications, and thus provide only the predefined services and resources associated with those rules and specifications. Embodiments of the invention resolve this limitation by implementing software code which, as described herein, enables the API to receive chip-design information (e.g., information relating to a chip design model and attributes for testing the chip-design model), as well as a regression simulation test request, from a client interface (e.g., of an end user) over a network protocol (such as, for example, HTTP), and dynamically generate and/or implement attributes of a regression simulation test to be executed by the server.

As understood herein, an attribute may be, for example, a variable to hold specific information (e.g., a value that can be any text or number) related to given test inputs and outputs. Some variables may be used as input to the test, while others may be collected after the test has been completed as part of the test's artifacts.

HTTP is a request/response protocol between clients and servers. A common application of HTTP is when Web-browser clients communicate with a Web server. The client sends a request to a server, which listens for client request messages. When the server receives a request, it returns a response, which contains the status of the request. If successful, optional data, such as a Web page, an error message, or other information is returned.

Furthermore, embodiments of the invention provide end users the ability to run their own queries on regression simulation test results without impacting the underlying data stored in the database by implementing a new language called Regression Query Language (RQL). RQL is based on HTTP and allows the API to be as flexible as a Structured Query Language (SQL), which is a standardized language typically used to communicate with a database. The RQL enables users to execute regression simulation tests remotely, query a database storing the test results, and analyze the query results (e.g., to calculate a coverage score and/or a regression analysis). As understood herein, a regression query may be one or more commands for executing (e.g., simulating) one or more tests based on one or more attributes (e.g., a set of one or more variables) in a simulator application or simulation environment. In some embodiments, regression queries may be retrieval tests which output, for example, functional coverage results, and/or code coverage results from one or more tests that were executed against a chip design model.

Additionally, embodiments of the invention allow users to query a database using REST over HTTP with JavaScript Object Notation (JSON) operations, as described herein. In some embodiments, the RQL may be hosted in a Java-based process with an embedded HTTP Server. The transport may be based on the industry standard REST (Representational state transfer) API.

JSON is a lightweight data-interchange format which is easy for humans to read and write, while also being easy for machines to parse and generate. It is based on a subset of the JavaScript Programming Language, Standard ECMA-262 3rd Edition—December 1999. JSON is a text format that is completely language independent but uses conventions that are familiar to programmers of the C-family of languages, including C, C++, C#, Java, JavaScript, Perl, Python, and many others. These properties make JSON an ideal data-interchange language. Of course, any programming language which can provide the functionality as described herein may also be used.

JSON is typically built on two structures: (1) A collection of name/value pairs (In various languages, this is realized, for example, as an object, record, structure, dictionary, hash table, keyed list, or associative array); and (2) An ordered list of values (In most languages, this is realized as an array, vector, list, or sequence. In some embodiments, RQL may use the JSON format in order to represent both request and response.).

In some embodiments, the RQL instance may be self-contained in a Java Virtual Machine (JVM) instance with an embedded Http Server. JVM is a memory space where classes (code) are loaded and objects (data) are shared. JVM is equivalent to an Operating System process. The RQL may be started or stopped with a dedicated command line script initiated by a user on a client-side device, and executed in a server-side processor.

In some embodiments as explained in detail herein, the RQL may connect an integration client (e.g., client-side interface and/or system) to a server-side API, which in turn, may communicate with a manager server. The manager server may communicate with a regression farm for executing regression simulation testing, and with a database in which regression simulation test results and other simulation data may be stored. In some embodiments, to start an RQL instance, a virtual port may be provided to the integration client in order to bind the HTTP transport. In such embodiments, clients may use this port in order to communicate the RQL instance.

In some embodiments, in order to communicate with the RQL instance (e.g., with the API or an instance of the API), a client may create a connection to the manager server (e.g., using a REST-over-HTTP protocol, for example), which may be configured to proxy the client's request into, for example, a new RQL instance (e.g., initiate a proxy instance), or an existing instance already in a pool of previously initiated RQL instances as described herein. A proxy, as understood herein, may be a routine, function, or process that acts as an intermediary for requests from clients seeking resources from other processes. Proxies may be used, for example, to free up and/or reallocate resources, to run multiple instances of a program, to improve scalability, etc. In accordance with various embodiments of the invention, a proxy instance, therefore, may be understood as execution (e.g., running) of the proxy (e.g., RQL code from an API) in a server that "holds" the proxy routine/function on behalf of the server manager. As such, in some embodiments, as requests are received by the server, each request can be executed by a proxy instance of the API (e.g., an RQL instance).

Furthermore, the RQL's REST endpoint access may be controlled and authenticated with an HTTP basic authentication protocol. In some embodiments, authentication may not be enabled by default. In order to enable this capability an environment variable may be populated with a required user token, for example: "setenv RQL-authentication-token admin". As such, only authenticated requests may reach the manager server.

As understood herein the API may support a variety of operations, as part of a "CRUD" interface implemented by the API. The acronym CRUD refers to the major functions that are typically implemented in relational database applications, e.g., Create, Read, Update, and Delete, and which are implemented in embodiments of the invention. Other functions may also be implemented in accordance with various embodiments, such as, for example, Search, Remove, etc. Such operations (and example corresponding outputs) may include, for example:

List—retrieve a list of entities;
Get—retrieve a single entity based on entity identification (ID);
Count—retrieve a total count of entities;
Update—update entities attribute or attributes;

In accordance with some embodiments, in order to support the various input type structures, the following example types may be formed (e.g., examples of the language for describing the specific criteria desired for an operation):

ListedRetrievalSpecification—extending GroupedRetrievalSpecification with sorting specification (For example, a list of runs may be retrieved based on a very specific criteria (e.g., filtering). ListedRetrievalSpecification may be an example way of telling the RQL instance what is the exact criteria required for the specific operation.)

GroupedRetrievalSpecification—extending the FilteredRetrievalSpecification with grouping specification and post group filter specification FilteredRetrievalSpecification—represent the most simple retrieval specification, contains filter and relation filter As such, in some embodiments, a set of example interface operations may be defined as follows:

list (ListedRetrievalSpecification)—return list of entities;
get (ID)—return entity;
count (GroupedRetrievalSpecification)—return count of entities;
update(EntitiesUpdateRequest)—void (where EntitiesUpdateRequest is a structure containing an instance of FilteredRetrievalSpecification and List of AttNameValue)

In other embodiments, additional and/or alternative interface operations may also be defined.

In some embodiments, the API can be requested from the RQL instance at any time. The RQL may then generate the required schema definition (based, for example, off JSON schema specification, available at http://json-schema.org/).

The API endpoint may, for example, be available at the $schema path according to the example descriptions in the following TABLE 1:

TABLE 1

| URL | Method | Description |
|---|---|---|
| vmgr/rest/$schema/list-components | GET | Get a json representation of all available components |
| vmgr/rest/$schema/list-actions?component=xyz | GET | Get a json representation of all available action for a given component |
| vmgr/rest/$schema/describe?component=xyz&action=abc | GET | Get a json representation of component/action description. The information includes: path, http method, input and output schemas. |

As described herein, in accordance with embodiments of the invention, the RQL implemented by the API may include a number of request type structures, which in some embodiments may be represented in JSON. As such, the client-side endpoints may require a JSON representation of the above defined example structures. Each endpoint may facilitate a single object request as described herein. In order to represent a request type, a JSON string may be formed (or generated) based on, for example, the example schema presented in the following

TABLE 2

| Structure | Description | Properties types/names | JSON structure example |
|---|---|---|---|
| FilteredRetrievalSpecification | Used to describe a simple retrieval specification, contains filter and relation filter | FilterSpec filter RelationFilterSpec relationFilter | {"filter":{...}, "relationFilter":{...}} |
| GroupedRetrievalSpecification | Used to describe a retrieval specification with filter, relation filter, grouping, and post grouping filter | FilterSpec filter RelationFilterSpec relationFilter String[ ] grouping FilterSpec postFilter | {"filter":{...}, "relationFilter":{...}}, "postFilter":{...} "grouping" ["att1", "att2"]} |
| ListedRetrievalSpecification | Used to describe a retrieval specification with filter, relation filter, grouping, post grouping filter, sorting and paging support | FilterSpec filter RelationFilterSpec relationFilter String[ ] grouping FilterSpec postFilter AttributeSortSpec[ ] sortSpec Integer pageOffset Integer pageLength | {"filter":{...}, "relationFilter":{...}}, "postFilter":{...} "grouping": ["att1", "att2"], "sortSpec":[{...},{...}],"pageOffset":0, "pageLenght":100} |
| EntitiesUpdateRequest | Used to describe the update request. Contains a filteredRetrievalSpecification and list of attribute name\new value pairs | FilteredRetrievalSpecification specification AttNameValue[ ] attValues | {"specification":{...},"attValues":[{... }, {...}]} |
| AttNameValue | Represent attribute name and value | String name String value | {"name":"status","value":"DISABLED"} |
| RelationFilterSpec | Represent relation filter by relation entity name and filter | FilterSpec filter; String relationName; | {"filter":{...},"relationName":"XYZ"} |
| AttributeSortSpec | Represent a sore specification by order and attribute name | String attName Enum direction [ASCENDING \| DESCENDING] | {"attName":"att1","direction":"ASCENDING"} |
| FilterSpec | Represent a filter (where clause) | Can be one of several filter types Each filter type will be recognized by a '@c' tag in order to define filter class | {"@c":".InFilter",... other properties related to sub filter...} |
| FilterSpec/InFilter | Represent IN filter with attribute name and valid list of values | enum operand [IN \| NOT_IN]; String attName; List<String>values; | {"@c":".InFilter","attName":"id", "operand":"IN", "values":["1","2"]} |
| FilterSpec/AttValueFilter | Represent single attribute operand filter | enum operand [* See valid values below] String attName String attValue | {"@c":".AttValueFilter","operand": "EQUALS","attName":"index","attValue": "1"} |
| FilterSpec/ExpressionFilter | Represent regular expression based filter | String attName String exp | {"@c":".ExpressionFilter","attName": "test_name","exp":"*2"} |

TABLE 2-continued

| Structure | Description | Properties types/names | JSON structure example |
|---|---|---|---|
| FilterSpec/ChainedFilter | Represent two or more filters with some AND\OR clause between. Chained filter can contains other chained filter so one can use it in order to describe complicated statements | Enum condition [ AND \| OR ]<br>FilterSpec[ ] chain | {"@c":".ChainedFilter","condition": "AND","chain":[{"@c":"..."‚...},{"@c":" ...",....}]} |

In some embodiments, valid values for the AttValueFilter operand property may include, for example, the following: EQUALS|NOT_EQUALS|GREATER_THAN| GREATER_OR_EQUALS_TO|LESS_THAN|LESS_OR_EQUALS_TO In some embodiments, users may request pre-defined request settings. For example, a pre-defined list action may be attached to the ListedRetrievalSpecification. In this example, supported settings may include, for example: (1) "write-hidden" (boolean)—retrieve hidden fields as well; and (1) "include-only" (List of Strings)—retrieve only the requested properties for each entity.

In some embodiments, users may be provided with the ability to build their own retrieval specification object (such as, for example, a JSON retrieval specification object). As shown in the example of TABLE 3 below, the API may be configured to provide users the ability to create a "runs list" regression query, starting with simple example attributes, and adding more and more capabilities. (Each line in the table is based on the previous one.)

Component: runs; Action: list; URL Example: POST: http://vlnx277:55000/vmgr/rest/runs/list:

| Added capability | Query |
|---|---|
| List all runs | { } |
| Add paging support, get 0-20 first results | {"pageOffset":0,"pageLength":20} |
| Sort result by ID | {"pageOffset":0,"pageLength":20, "sortSpec":[{"attName":"id","direction":"ASCENDING"}]} |
| Select only runs where test_name ends with '2' | {"pageOffset":0,"pageLength":20, "filter":{"@c":".ExpressionFilter","attName":"test_name","exp":"*2"}, "sortSpec":[{"attName":"id","direction":"ASCENDING"}]} |
| Add group on status field | {"pageOffset":0,"pageLength":20, "filter":{"@c":".ExpressionFilter","attName":"test_name","exp":"*2"}, "grouping":["status"], "sortSpec":{"attName":"id","direction":"ASCENDING"}]} |
| Add group by test name (with status) | {"pageOffset":0,"pageLength":20, "filter":{"@c":".ExpressionFilter","attName":"test_name","exp":"*2"}, "grouping":["status", "test_name"], "sortSpec":{"attName":"id","direction":"ASCENDING"}]} |
| Add post grouping filter, select only failures | {"pageOffset" :0,"pageLength":20, "filter":{"@c":".ExpressionFilter","attName":"test_name","exp":"*2"}, "grouping":["status", "test_name"], "postFilter":{"@c":".AttValueFilter","operand":"EQUALS","attName":"status","attValue":"failed" }, "sortSpec":[{"attName":"id","direction":"ASCENDING"}]} |
| Deep dive, use chained filter to create the base filter tree, add additional "not in" filter with AND condition | {"pageOffset":0,"pageLength":20, "filter":{"@c":".ChainedFilter","condition":"AND",<br>  "chain":[<br>    {"@c":".InFilter","operand":"NOT_IN","attName":"index","values":["1", "2"]},<br>    {"@c":".ExpressionFilter","attName":"test_name","exp":"*2"}<br>  ]<br>},<br>"grouping":["status", "test_name"],<br>"postFilter":{"@c":".AttValueFilter","operand":"EQUALS","attName":"status","attValue":"failed"<br>},<br>"sortSpec":[{"attName":"id","direction":"ASCENDING"}]} |
| Add association\relation filter, select only runs that belongs to sessions id in 1, 2, 3 | {"pageOffset":0,"pageLength":20, "filter":{"@c":".ChainedFilter","condition":"AND",<br>  "chain":[<br>    {"@c":".InFilter","operand":"NOT_IN","attName":"index","values":["1", "2"]},<br>    {"@c":".ExpressionFilter","attName":"test_name","exp":"*2"}<br>  ]<br>},<br>"relationFilter":{"relationName":"session","filter":{"@c":".InFilter","attName":"id","operand": "IN","values":["1","2","3"]}},<br>"grouping":["status", "test_name"],<br>"postFilter":{"@c":".AttValueFilter","operand":"EQUALS","attName":"status","attValue":"failed"<br>},<br>"sortSpec":[{"attName":"id","direction":"ASCENDING"}]} |

Of course, the language, syntax, and code implementation described herein are intended as examples only and other or different languages, syntax, and codes may be used.) These and other features of embodiments of the invention will be further understood with reference to FIGS. 1-3 as described herein.

FIG. 1 shows a high level diagram illustrating an example configuration of a system 100 for providing a scalable server-implemented regression query environment for remote testing and analysis of a chip-design model, according to at least one embodiment of the invention. System 100 includes network 105, which may include the Internet, one or more telephony networks, one or more network segments including local area networks (LAN) and wide area networks (WAN), one or more wireless networks, or a combination thereof. System 100 also includes a system server 110 constructed in accordance with one or more embodiments of the invention. In some embodiments, system server 110 may be a stand-alone computer system. In other embodiments, system server 110 may include a network of operatively connected computing devices, which communicate over network 105. Therefore, system server 110 may include multiple other processing machines such as computers, and more specifically, stationary devices, mobile devices, terminals, and/or computer servers (collectively, "computing devices"). Communication with these computing devices may be, for example, direct or indirect through further machines that are accessible to the network 105.

System server 110 may be any suitable computing device and/or data processing apparatus capable of communicating with computing devices, other remote devices or computing networks, receiving, transmitting and storing electronic information and processing requests as further described herein. System server 110 is therefore intended to represent various forms of digital computers, such as laptops, desktops, workstations, personal digital assistants, servers, blade servers, mainframes, and other appropriate computers and/or networked or cloud based computing systems capable of employing the systems and methods described herein.

System server 110 may include a server processor 115 which is operatively connected to various hardware and software components that serve to enable operation of the system 100. Server processor 115 serves to execute instructions to perform various operations relating to chip-design testing and analysis, and other functions of embodiments of the invention as will be described in greater detail below. Server processor 115 may be one or a number of processors, a central processing unit (CPU), a graphics processing unit (GPU), a multi-processor core, or any other type of processor, depending on the particular implementation. System server 110 may be configured to communicate via communication interface 120 with various other devices connected to network 105. For example, communication interface 120 may include but is not limited to, a modem, a Network Interface Card (NIC), an integrated network interface, a radio frequency transmitter/receiver (e.g., Bluetooth wireless connection, cellular, Near-Field Communication (NFC) protocol, a satellite communication transmitter/receiver, an infrared port, a USB connection, and/or any other such interfaces for connecting the system server 110 to other computing devices and/or communication networks such as private networks and the Internet.

In certain implementations, a server memory 125 is accessible by server processor 115, thereby enabling server processor 115 to receive and execute instructions such a code, stored in the memory and/or storage in the form of one or more software modules 130, each module representing one or more code sets. The software modules 130 may include one or more software programs or applications (collectively referred to as the "server application") having computer program code or a set of instructions executed partially or entirely in server processor 115 for carrying out operations for aspects of the systems and methods disclosed herein, and may be written in any combination of one or more programming languages. Server processor 115 may be configured to carry out embodiments of the present invention by for example executing code or software, and may be or may execute the functionality of the modules as described herein.

As shown in FIG. 1, the exemplary software modules may include a communication module 135, an API module 140, and a manager server module 145. Communication module 135 may be executed by server processor 115 to facilitate communication between system server 110 and the various software and hardware components of system 100, such as, for example, server database 150 and/or client device 155 as described herein. API module 140, as described in detail herein, may be executed by server processor 115 to implement extensive and dynamic functionality of the API. Manager server module 145 may be executed by server processor 115 to collect the test results of regression simulation tests executed by the API in regression farms, execute queries on regression simulation test results stored in server database 150, etc. As described herein, the API may then calculate a coverage score, analyze query results, etc. A coverage score, as understood herein, may be a representation of the amount of structural and/or functional coverage which would be achieved by actualization of the chip-design model in a manufactured chip.

It should be noted that in accordance with various embodiments of the invention, server modules 130 may be executed entirely on system server 110 as a stand-alone software package, partly on system server 110 and partly on client device 155, or entirely on client device 155.

Server memory 125 may be, for example, a random access memory (RAM) or any other suitable volatile or non-volatile computer readable storage medium. Server memory 125 may also include storage which may take various forms, depending on the particular implementation. For example, the storage may contain one or more components or devices such as a hard drive, a flash memory, a rewritable optical disk, a rewritable magnetic tape, or some combination of the above. In addition, the memory and/or storage may be fixed or removable. In addition, memory and/or storage may be local to the system server 110 or located remotely.

In accordance with further embodiments of the invention, system server 110 may be connected to one or more database(s) 150, for example, directly or remotely via network 105. Database 150 may include any of the memory configurations as described above, and may be in direct or indirect communication with system server 110. In some embodiments, database 150 stores the results generated by one or more regression farms in which the API executes regression simulation tests. In some embodiments, database 150 may store information related to analysis of simulation tests (e.g., query results). As understood herein, a regression farm is a collection of servers and/or processors configured to run and/or execute many regression simulation tests.

As described herein, among the computing devices on or connected to the network 105 may be one or more client devices 155. Client device 155 may be any standard computing device. As understood herein, in accordance with one or more embodiments, a computing device may be a stationary computing device, such as a desktop computer, kiosk and/or other machine, each of which generally has one or more processors, such as client processor 160, configured to execute code to implement a variety of functions, a computer-readable memory, such as client memory 165, a client communication interface 170, for connecting to the network 105, one or more client modules, such as integration client module 175, one or more input devices, such as input devices 180, and one or more output devices, such as output devices 185. Typical input devices, such as, for example, input devices 185, may include a keyboard, pointing device (e.g., mouse or digitized stylus), a web-camera, and/or a touch-sensitive display, etc. Typical output devices, such as, for example output device 185 may include one or more of a monitor, display, speaker, printer, etc.

In some embodiments, integration client module 175 may be executed by client processor 160 to provide the various functionalities of client device 155. In particular, in some embodiments, integration client module 175 may provide a client-side interface with which a user of client device 155 can interact, to, among other things, query regression simulation test results (e.g., by providing one or more regression queries), receive, and analyze results, etc.

Additionally or alternatively, a computing device may be a mobile electronic device ("MED"), which is generally understood in the art as having hardware components as in the stationary device described above, and being capable of embodying the systems and/or methods described herein, but which may further include componentry such as wireless communications circuitry, gyroscopes, inertia detection circuits, geolocation circuitry, touch sensitivity, among other sensors. Non-limiting examples of typical MEDs are smartphones, personal digital assistants, tablet computers, and the like, which may communicate over cellular and/or Wi-Fi networks or using a Bluetooth or other communication protocol. Typical input devices associated with conventional MEDs include, keyboards, microphones, accelerometers, touch screens, light meters, digital cameras, and the input jacks that enable attachment of further devices, etc.

In some embodiments, client device 155 may be a "dummy" terminal, by which processing and computing may be performed on system server 110, and information may then be provided to client device 155 via server communication interface 120 for display and/or basic data manipulation. In some embodiments, modules depicted as existing on and/or executing on one device may additionally or alternatively exist on and/or execute on another device. For example, in some embodiments, API module 140, which is depicted in FIG. 1 as existing and executing on system server 110, may additionally or alternatively exist and/or execute on client device 155.

Figure 2:
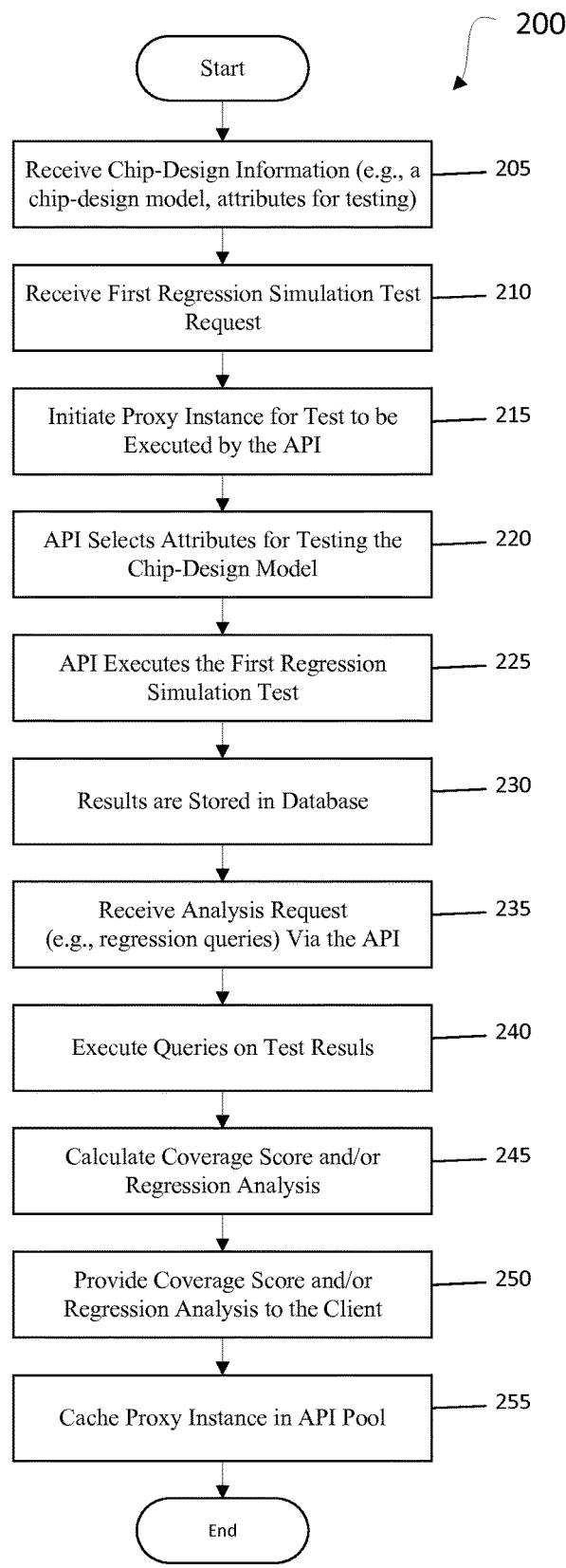
FIG. 2 is a flow diagram of a method of providing a scalable server-implemented regression query environment for remote testing and analysis of a chip-design model according to at least one embodiment of the invention.

FIG. 2 shows a flow diagram of a method of providing a scalable server-implemented regression query environment for remote testing analysis of a chip-design model according to at least one embodiment of the invention. In some embodiments as described herein, the regression query environment may be scaled (e.g., expanded) by implementing proxy instances of the API to handle client initiated requests as required. Method 200 starts at step 205 when system server 110, using server processor 115, which is configured by executing one or more server modules 130, including, preferably, communication module 135, receives at system server 110, chip-design information the chip-design model to be tested and/or one or more attributes for testing the chip design model. In some embodiments, the chip-design information may be received in one proprietary file in advance of a planned testing. Of course, in other embodiments, the chip-design model and the one or more attributes may be received separately, for example, in different files and/or at different times. The received chip-design model and/or the one or more attributes may then be stored, for example, in memory (such as, for example, server memory 125 or server database 150) for future use.

At step 210, the system server 110 may be configured by code executing in server processor 115 represented by communication module 135 to receive, at system server 110, a first regression simulation test request from a client-side integration client (such as, for example, integration client module 175). In some embodiments, the first regression simulation request may include, for example, a request to execute (e.g., launch) the chip-design information file. In other embodiments, the actual chip-design model and the one or more attributes to be tested may be retrieved from the file. In some embodiments, the first regression simulation request may be received (e.g., processed and/or handled) directly by API module 140, while in other embodiments, the first regression simulation request may be initially received (e.g., processed and/or handled) by manager server module 145, whereupon it is proxied (e.g., directed) to API module 140, as described herein.

At step 215, the system server 110 may be configured by code executing in server processor 115 represented by manager server module 145 to initiate a proxy instance for a first regression simulation test to be executed by the API (e.g., API module 140), for example, based on the first regression simulation test request. As described herein, a client may create a connection to the manager server (e.g., using a REST-over-HTTP protocol, for example), which may be configured to proxy the client's request into, for example, a new RQL instance (e.g., an proxy instance of the API). In some embodiments, to initiate the proxy instance, manager server module 145 may instruct (e.g., request, send a signal, provide some instruction or indicator, etc.) API module 140 to execute the proxy instance (e.g., launch an API instance) on behalf of the client-side server manager.

At step 220, the system server 110 may be configured by code executing in server processor 115 represented by API module 140 to select at least one of the one or more attributes (e.g., one or more variables) for testing the chip-design model based at least in part on the chip-design information. In some embodiments selecting may include, for example, retrieving or receiving at least one of the one or more attributes that were previously provided by the client to system server 110. Furthermore, in some embodiments, API module 140 may be configured to select (e.g., retrieve or receive) all provided attributes at once, while in other embodiments, API module 140 may be configured to select less than all provided attributes.

At step 225, the system server 110 may be configured by code executing in server processor 115 represented by API module 140 to execute (e.g., launch) the first regression simulation test on the chip-design model using the selected at least one of the one or more attributes. As described in detail herein, a regression simulation test may include execution of, for example, hundreds, thousands, or millions of simulations. In some embodiments, these simulations may be carried out (e.g., launched) in regression farms, which may include may servers and/or processors for running the various simulations for the chip-design model based on the attributes. In some embodiments, while the API instance is executing the first regression simulation test, the server-side database manager (e.g., manager server module 145) may be configured to monitor the first regression simulation test, for example, to detect errors, collect data, etc.

At step 230, the system server 110 may be configured by code executing in server processor 115 represented by manager server module 145 to store one or more results of the first regression simulation test in a database. In some embodiments, results may be collected (e.g., recorded in system memory) during the monitoring process (e.g., as the test is being run), and then store all the results in database 150 upon completion of the test. In other embodiments, results may be stored in the database in batches, for example, on a daily basis or some other time interval, or based on some other variable (e.g., number of simulations runs, size for results, etc.). In yet other embodiments, each result may be store as the simulation is completed.

In some embodiments, these results may be stored in fields of the database and/or indexed, for example, for future retrieval and/or analysis, etc. Furthermore, in some embodiments, information relating to the one or more results of the first regression simulation test may be provided to the client-side integration client via the network, such as, for example, any errors that occur or issues that are detected during the testing, a notification that testing has completed, etc. In some embodiments, one or more of the actual results may be provided to the client as well (though the results typically represent large amounts of data, which may be difficult to transfer, store, and/or manage by a client). In some embodiments, the one or more results of the first regression simulation test may be stored in the database as write-protected data. In some embodiments, the server may be configured to incorporate the one or more attributes of the first regression simulation test in a second regression simulation test, which, in some embodiments, may be a follow-up regression simulation test by the same client and/or the same chip-design information. In some embodiments, the second regression simulation may be a regression simulation test requested by other clients. In some embodiments, the second simulation test may be a follow-up simulation test of the same chip design model, but with different testing specifications, and/or it may be a different chip design entirely.

At step 235, the system server 110 may be configured by code executing in server processor 115 represented by communication module 135 to receive at system server 110, an analysis request comprising at least instructions relating to one or more queries (e.g., regression queries) to be executed by the server-side database manager on the one or more results of the first regression simulation test stored in the database. In some embodiments, the analysis request may be received via the API (or an instance thereof). In such embodiments, as described in detail with regard to steps 210-215, manager server module 145 may instruct (e.g., request, send a signal, provide some instruction or indicator, etc.) API module 140 to initiate a proxy instance, which may execute the proxy instance (e.g., launch an API instance) on behalf of the client-side server manager. The API can then determine what specific analysis request the client has made and implement next steps accordingly.

In some embodiments, the one or more queries (e.g., regression queries) include a user-defined set of one or more fields to be searched in the database. For example, a query may request all test results related to a particular attribute, all test results stored on a particular date, etc. As such, a user (e.g., client) may define a set of fields in which such results may be found and from which such results may be retrieved. In some embodiments, the API creates the analysis based on the fields of interest. A test can have hundreds of fields, and as such, in some embodiments, the RQL language configures the API to be able to retrieve or filter based on the various fields.

At step 240, the system server 110 may be configured by code executing in server processor 115 represented by manager server module 145 to execute (e.g., by the server-side database manager) the one or more queries on the one or more results of the first regression simulation test to produce one or more query results. In some embodiments, for example, when the API is configured to determine what specific analysis request is being requested by the client, the API may provide instructions to the manager server module 145 to execute the one or more queries on the regression simulation test results. In some embodiments, once the test results have been queried, the one or more query results may be returned to the API for further analysis.

In accordance with various embodiments of the invention, the RQL may enable the API to dynamically generate queries for the data based on the provided attributes without affecting the underlying data, which may, in some embodiments, be write-protected for additional security. As such, the API may be able to query the database with queries that have been previously undefined and unknown to the server (e.g., were not previously included in any predefined query of manager server module 145).

At step 245, the system server 110 may be configured by code executing in server processor 115 represented by API module 140 to calculate, by the API, at least one of a coverage score and a regression analysis for the chip-design model based on the analysis request and the one or more query results. As explained herein, in some embodiments, a coverage score may be a representation of the amount of structural and/or functional coverage which would be achieved by actualization of the chip-design model in a manufactured chip. Clients test chip design models to determine such aspects as functional and structural integrity of the design. A key indicator of functional and structural integrity is the percentage of the chip design model that was actively used during the simulations. Therefore, in some embodiments, the coverage score may represent a percentage of the chip that was used during execution of the first regression simulation test (e.g., the coverage score may simply be the percentage of the chip design model in which activity was detected during the simulations). In other embodiments, the coverage score may include other measurements and related information (e.g., ratio in comparison to an expected result) in addition to or in place of the percentage. In some embodiments, various calculations representing aspects of a coverage score may be defined by the user, for example, prior to and/or after execution of the simulation test, or may be predefined by the system.

As understood herein, regression analysis is a statistical process for estimating the relationships among variables. It includes many techniques for modeling and analyzing several variables, for example, to ascertain the causal effect of one variable upon another. Regression analysis may also be used to analyze the relationship between a dependent variable and one or more independent variables. As such, in embodiments of the invention, the API may calculate a regression analysis, for example, to determine relationships between different query results.

At step 250, the system server 110 may be configured by code executing in server processor 115 represented by communication module 135 to provide a calculated coverage score and/or a calculated regression analysis to the client-side integration client via the network. In some embodiments, the process may again be handled by the API instance, while in other embodiments calculated coverage scores and/or regression analyses may be provided by the server in a convention communication manner, such as, for example via e-mail or form of digital communication/notification.

Finally, at step 255, the system server 110 may be configured by code executing in server processor 115 represented by manager server module 145 to cache the proxy instance in an API pool to serve an additional request. As understood herein, an API pool may be a cache of API processes (e.g., API instances), which have been cached (e.g., saved in local memory such as, for example, server memory 125) such that an API process can be reused if and when future requests to the API are required and/or a new request requiring a new API is entered in the system.

In some embodiments, the API process (e.g., a proxy instance of the API) may be configured to destroy itself immediately upon completion of the process, while in other embodiments the API process may be configured to wait for a certain period of time in the pool of API processes to see if it is needed. In some embodiments, the system may be configured to terminate the proxy instance when it has not been reused within a predetermined period of time, and/or upon the occurrence of a predefined event such as, for example, the end of the first regression simulation test or the end of the regression query, etc. It should be noted that an API process may be cached at any point in time during the lifecycle of the API, depending on the system configuration. As such, in some embodiments an API process may be cached during the testing stage and/or during the analysis stage, once it is no longer needed. An additional request, as understood herein, may be a follow-up request by the same client, for example if the client desires additional analysis, and/or requests by other clients as well.

Figure 3:
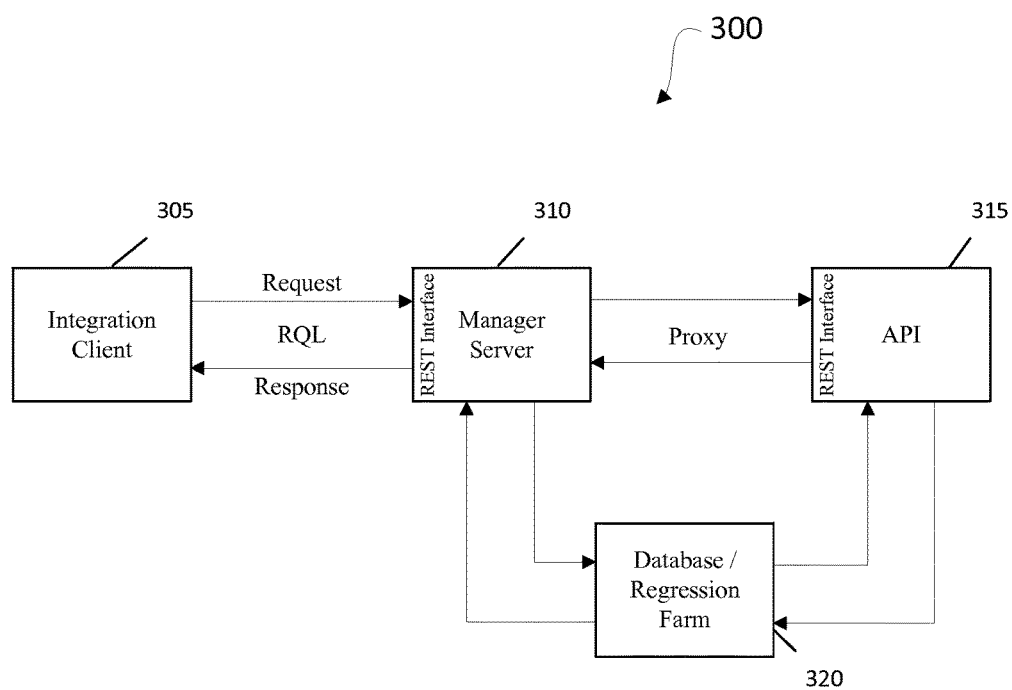
FIG. 3 is a general block diagram representing the data flow between key components according to at least one embodiment of the invention.

Turning now to FIG. 3, is a general block diagram representing the data flow between key components according to at least one embodiment of the invention. The block diagram is intended to represent the flow of data and information from and between different parts of the system. As such, in some embodiments, Block diagram 300 does not necessarily have a starting and ending point, but may be understood instead as a visualization of relationships representing ongoing communication within the system. As such, the following example communication relationships are shown: Integration client 305 may communicate with manager server 310 by sending requests over an HTTP protocol, for example, and receiving responses in return. As described in detail herein, this communication may be implemented via RQL over HTTP protocol and may be implemented using REST architecture (e.g., a REST interface).

Manager server 310 may further communicate with API 315 to, for example, proxy the client's request into a new RQL instance (e.g., initiate a proxy instance of the API), provide the API with the chip-design model to be tested and/or one or more attributes for testing the chip design model, etc. As with manager server 310, API 315 may also be implemented using a REST architecture, for example. Manager server 315 may also communicate with database/regression farm 320, for example, to store data in the database, execute queries on the regression simulation test results (e.g., data) contained in the database, etc.

API 315 may communicate with database/regression farm 320, for example, to execute a regression simulation test in the regression farm. Of course, as described herein, results of regression simulation tests and/or of analysis requests (e.g., queries of regression simulation test results) may be communicated back to API 315, for further analysis and/or for communicating the information back to the integration client 305. API 315 may further communicate with manager server 310, for example, to request that manager server 310 execute one or more queries on the test results stored in database/regression farm 320.

Information may be passed from database/regression farm 320 back to integration client 305 via manager server 310 and/or API 315. The chain of communication and data flow may enable each part to implement its intended system functions. Of course, one or more of the blocks may be part of the same physical device, such as a single database server with an integrated HTTP based API.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

What is claimed is:

1. A method for providing a scalable server-implemented regression query environment for remote testing and analysis of a chip-design model, the remote testing and analysis being provided via an application programming interface (API) executed by a processor of a server and a server-side database manager also executed by the processor of the server, the server being in communication with a client-side integration client via a network, the method comprising:
 receiving, at the server, chip-design information, wherein the chip-design information comprises at least the chip-design model to be tested and one or more attributes for testing the chip design model;
 receiving, at the server, a first regression simulation test request from the client-side integration client;
 initiating by the server-side database manager, a proxy instance for a first regression simulation test to be executed by the API, based on the first regression simulation test request;
 selecting, by the API, at least one of the one or more attributes for testing the chip-design model based at least in part on the chip-design information;
 executing by the API, the first regression simulation test on the chip-design model using the selected at least one of the one or more attributes;
 monitoring, by the server-side database manager, the first regression simulation test during execution of the first regression simulation test; and
 storing, by the server-side database manager, one or more results of the first regression simulation test in a database.

2. The method as in claim 1, further comprising: providing information relating to the one or more results of the first regression simulation test to the client-side integration client via the network.

3. The method as in claim 1, further comprising:
 receiving, at the server, via the API, an analysis request comprising at least instructions relating to one or more queries to be executed by the server-side database manager on the one or more results of the first regression simulation test stored in the database;

executing, by the server-side database manager, the one or more queries on the one or more results of the first regression simulation test to produce one or more query results, wherein the one or more query results are returned to the API based on the one or more queries; and calculating, by the API, at least one of a coverage score and a regression analysis for the chip-design model based on the analysis request and the one or more query results.

4. The method as in claim 3, further comprising providing the at least one of the calculated coverage score and the calculated regression analysis to the client-side integration client via the network.

5. The method as in claim 3, wherein the one or more queries comprise a user-defined set of one or more fields to be searched in the database.

6. The method as in claim 3, wherein the coverage score represents a percentage of the chip that was used during execution of the first regression simulation test.

7. The method as in claim 1, further comprising incorporating the one or more attributes of the first regression simulation test in a second regression simulation test.

8. The method as in claim 1, wherein the one or more results of the first regression simulation test stored in the database are stored as write-protected data.

9. The method as in claim 1, wherein the first regression simulation test is executed by the API in a regression farm.

10. The method as in claim 1, further comprising:
caching the proxy instance in an API pool to serve an additional request; and
terminating the proxy instance when it has not been reused within a predetermined period of time.

11. A system for providing a scalable server-implemented regression query environment for remote testing and analysis of a chip-design model, comprising:
a server having a processor and memory, the server being in communication with a client-side integration client via a network; and
an application programming interface (API) and a server-side database manager, wherein the API and the server-side database manager are stored in the memory and executable in the processor, and, when executed, configure the processor of the server to:
receive chip-design information, wherein the chip-design information comprises at least the chip-design model to be tested and one or more attributes for testing the chip design model;
receive a first regression simulation test request from the client-side integration client;
initiate, by the server-side database manager, a proxy instance for a first regression simulation test to be executed by the API, based on the first regression simulation test request;
select, by the API, at least one of the one or more attributes for testing the chip-design model based at least in part on the chip-design information;
execute, by the API, the first regression simulation test on the chip-design model using the selected at least one of the one or more attributes;
monitor, by the server-side database manager, the first regression simulation test during execution of the first regression simulation test; and
store, by the server-side database manager, one or more results of the first regression simulation test in a database.

12. The system as in claim 11, further configured to provide information relating to the one or more results of the first regression simulation test to the client-side integration client via the network.

13. The system as in claim 11, further configured to:
receive, at the server, via the API, an analysis request comprising at least instructions relating to one or more queries to be executed by the server-side database manager on the one or more results of the first regression simulation test stored in the database;
execute, by the server-side database manager, the one or more queries on the one or more results of the first regression simulation test to produce one or more query results, wherein the one or more query results are returned to the API based on the one or more queries; and
calculate, by the API, at least one of a coverage score and a regression analysis for the chip-design model based on the analysis request and the one or more query results.

14. The system as in claim 13, further configured to provide the at least one of the calculated coverage score and the calculated regression analysis to the client-side integration client via the network.

15. The system as in claim 13, wherein the one or more queries comprise a user-defined set of one or more fields to be searched in the database.

16. The system as in claim 13, wherein the coverage score represents a percentage of the chip that was used during execution of the first regression simulation test.

17. The system as in claim 11, further configured to incorporate the one or more attributes of the first regression simulation test in a second regression simulation test.

18. The system as in claim 11, wherein the one or more results of the first regression simulation test stored in the database are stored as write-protected data.

19. The system as in claim 11, wherein the first regression simulation test is executed by the API in a regression farm.

20. The system as in claim 11, further configured to:
Cache the proxy instance in an API pool to serve an additional request; and
terminate the proxy instance when it has not been reused within a predetermined period of time.

* * * * *